United States Patent
Harrer et al.

(10) Patent No.: US 11,015,258 B2
(45) Date of Patent: *May 25, 2021

(54) FEEDBACK CONTROL OF DIMENSIONS IN NANOPORE AND NANOFLUIDIC DEVICES

(71) Applicant: International Business Machines Corporation, Armonk, NY (US)

(72) Inventors: Stefan Harrer, New York, NY (US); Stephen M. Rossnagel, Pleasantville, NY (US); Philip S. Waggoner, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/442,885

(22) Filed: Jun. 17, 2019

(65) Prior Publication Data
US 2019/0323138 A1    Oct. 24, 2019

Related U.S. Application Data

(60) Continuation of application No. 15/242,516, filed on Aug. 20, 2016, now Pat. No. 10,323,333, which is a
(Continued)

(51) Int. Cl.
*C25D 9/06* (2006.01)
*B81C 1/00* (2006.01)

(52) U.S. Cl.
CPC ............ *C25D 9/06* (2013.01); *B81C 1/00071* (2013.01); *B81C 2201/0114* (2013.01)

(58) Field of Classification Search
CPC .............................................. C25D 11/02–34
See application file for complete search history.

(56) References Cited

U.S. PATENT DOCUMENTS 3,836,441 A    9/1974    Millington
4,624,048 A *  11/1986   Hinkel ................... G11B 5/102
                                                216/102
(Continued)

FOREIGN PATENT DOCUMENTS

CN    1577935    2/2005
CN    1690256    11/2005
(Continued)

OTHER PUBLICATIONS

P.R. China State Intellectual Property Office, Office Action dated Dec. 3, 2014, Chinese Office Action CN2011852447 dated Aug. 16, 2011 (in Chinese; significance of references in p. 5 category table—X or A).

(Continued)

*Primary Examiner* — Brian W Cohen
*Assistant Examiner* — Ho-Sung Chung
(74) *Attorney, Agent, or Firm* — L. Jeffrey Kelly; Otterstedt, Wallace & Kammer, LLP

(57) ABSTRACT

Nanofluidic passages such as nanochannels and nanopores are closed or opened in a controlled manner through the use of a feedback system. An oxide layer is grown or removed within a passage in the presence of an electrolyte until the passage reaches selected dimensions or is closed. The change in dimensions of the nanofluidic passage is measured during fabrication. The ionic current level through the passage can be used to determine passage dimensions. Fluid flow through an array of fluidic elements can be controlled by selective oxidation of fluidic passages between elements.

5 Claims, 9 Drawing Sheets

Related U.S. Application Data division of application No. 13/021,544, filed on Feb. 4, 2011, now Pat. No. 9,422,154.

(60) Provisional application No. 61/409,353, filed on Nov. 2, 2010.

(56) References Cited

U.S. PATENT DOCUMENTS

| | | | |
|---|---|---|---|
| 5,030,331 | A | 7/1991 | Sato |
| 6,139,713 | A | 10/2000 | Masuda et al. |
| 9,422,154 | B2 | 8/2016 | Harrer et al. |
| 10,316,423 | B2 | 6/2019 | Harrer et al. |
| 10,323,333 | B2 | 6/2019 | Harrer et al. |
| 2005/0026030 | A1 | 2/2005 | Mardilovich et al. |
| 2005/0136609 | A1 | 6/2005 | Mosley et al. |
| 2006/0219568 | A1 | 10/2006 | Hotta et al. |
| 2007/0110639 | A1 | 5/2007 | Joshi et al. |
| 2007/0286773 | A1 | 12/2007 | Schlautmann et al. |
| 2008/0177021 | A1 | 7/2008 | Berlin et al. |
| 2008/0241866 | A1 | 10/2008 | Korlach et al. |
| 2009/0240013 | A1 | 9/2009 | Timmons et al. |
| 2009/0305273 | A1 | 12/2009 | Cao et al. |
| 2010/0200991 | A1 | 8/2010 | Akolkar et al. |
| 2011/0117637 | A1* | 5/2011 | Gray .............. G01N 21/6452 435/287.2 |
| 2011/0174629 | A1 | 7/2011 | Bouchet et al. |

FOREIGN PATENT DOCUMENTS

| | | |
|---|---|---|
| DE | 41326430 | 2/1995 |
| JP | 2010510476 A | 4/2010 |
| JP | 2011511167 A | 4/2011 |
| KR | 20080058104 | 6/2008 |
| KR | 20100053374 | 5/2010 |
| WO | WO2007047523 | 4/2007 |
| WO | WO2009109727 | 9/2009 |

OTHER PUBLICATIONS

Petrossian et al: "High aspect ratio cylindrical nanopores in silicon-on-insulator substrates", Solid State Electronics, Elsevier Science Publishers, Barking, GB, vol. 51, No. 10, Oct. 12, 2007 (Oct. 12, 2007), pp. 1391-1397 (available on-line Aug. 7, 2007).

Soni et al: "Synchronous optical and electrical detection of biomolecules traversing through solid-state nanopores", Review of Scientific Instruments, AIP, Melville, NY, US, vol. 81, No. 1, Jan. 19, 2010 (Jan. 19, 2010), 9 pages beginning at 14301.

Authorized Officer Agnes Wittmann-Regis, International Preliminary Report on Patentability, PCT International patent Application No. PCT/EP2011/064085, European Patent Office, dated May 7, 2013, pp. 1-8.

Chang et al., Fabrication of Polymeric Nano-Valve Array for Biomedical Applications, Proc. of ASME 2010 First Global Congress on NanoEng. for Med. and Bio. (Feb. 8, 2010), pp. 31-34.

Wikipedia, Anodizing (Apr. 23, 2009), pp. 1-6.

Paul J. Otterstedt, List of IBM Patents or Patent Applications Treated As Related, Aug. 7, 2019, pp. 1-2.

* cited by examiner

FEEDBACK CONTROL OF DIMENSIONS IN NANOPORE AND NANOFLUIDIC DEVICES

CROSS-REFERENCE TO RELATED APPLICATIONS

This application is a continuation of U.S. patent application Ser. No. 15/242,516 filed Aug. 20, 2016, and entitled FEEDBACK CONTROL OF DIMENSIONS IN NANOPORE AND NANOFLUIDIC DEVICES, which is in turn a division of U.S. patent application Ser. No. 13/021,544 filed Feb. 4, 2011, and entitled FEEDBACK CONTROL OF DIMENSIONS IN NANOPORE AND NANOFLUIDIC DEVICES, which in turn claims the benefit of U.S. Provisional Patent Application Ser. No. 61/409,353 filed on Nov. 2, 2010, and entitled FEEDBACK-CONTROL OF CRITICAL DIMENSIONS IN NANOPORE AND NANOFLUIDIC DEVICES. The complete disclosures of U.S. patent application Ser. No. 15/242,516, U.S. patent application Ser. No. 13/021,544, and U.S. Provisional Patent Application Ser. No. 61/409,353 are all hereby expressly incorporated herein by reference in their entireties for all purposes.

FIELD OF THE INVENTION

The present invention relates to the microfluidic and nanofluidic arts, and, more particularly, to the fabrication and use of nanoscale fluidic elements and the like.

BACKGROUND OF THE INVENTION

Nanoscale fluidic devices include pores and/or channels formed in selected substrates. A solid-state nanopore may be fabricated through TEM (transmission electron microscope) drilling through a selected substrate such as silicon nitride. Solid-state nanopores can be used to analyze biological proteins.

Nanofluidic channels may be fabricated by serial electron beam lithography in order to reach the desired dimensions. Channels can also be fabricated using photolithography, nanoimprint lithography and nanotransfer lithography.

SUMMARY OF THE INVENTION

Principles of the invention provide techniques for fabricating fluidic passages such as nanofluidic channels and nanopores. In one aspect, an exemplary method includes the steps of providing a substrate comprising a nanofluidic passage bounded by an electrical conductor, filling the nanofluidic passage with an electrolyte, and causing the nanofluidic passage to at least partially close by electrochemically forming an oxide layer on the conductor. The substrate itself can be comprised of an electrically conductive material or an electrically conductive material can be deposited on the substrate such that the surface of the nanofluidic passage comprises such material.

A further exemplary method includes the steps of providing an array of fluidic elements, each of the fluidic elements being connected to one or more other fluidic elements in the array by one or more nanofluidic passages, each of the nanofluidic passages including an electrically conductive surface, and selectively closing one or more of the nanofluidic passages by causing an oxidized layer to electrochemically grow on the electrically conductive surface in selected nanofluidic passages.

A further exemplary method includes the steps of forming a nanofluidic passage having larger than targeted dimensions in a substrate, forming a conductive layer on the substrate, thereby reducing the dimensions of the nanofluidic passage, filling the nanofluidic passage with an electrolyte, and electrochemically oxidizing the conductive layer until the fluidic passage has the targeted dimensions.

Another exemplary method includes providing a nanofluidic device including a nanofluidic passage having an electrically conductive surface and an electrolyte within the nanofluidic passage and applying a voltage to the electrically conductive surface to electrochemically change the dimensions of the nanofluidic passage. The dimensions can be increased or decreased.

An exemplary computer program product is provided for controlling the fabrication of a nanofluidic device including a nanofluidic passage in a substrate, the nanofluidic passage comprising an electrically conductive surface and containing an electrolyte. The product includes a computer readable storage medium having computer readable program code embodied therewith, said computer readable program code comprising computer readable program code configured to facilitate applying an electric potential between the electrolyte and the electrically conductive surface sufficient to cause oxidation of the electrically conductive surface, and computer readable program code configured to monitor ionic current through the nanofluidic passage.

As used herein, "facilitating" an action includes performing the action, making the action easier, helping to carry the action out, or causing the action to be performed. Thus, by way of example and not limitation, instructions executing on a processor might facilitate an action carried out by a remote device, such as a voltage supply, meter, microscope stage, or the like, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a tangible computer readable recordable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s), or (iii) a combination of hardware and software modules; any of (i)-(iii) implement the specific techniques set forth herein, and the software modules are stored in a tangible computer-readable recordable storage medium (or multiple such media).

Techniques of the present invention can provide substantial beneficial technical effects. For example, one or more embodiments may provide one or more of the following advantages: 1) fabricating nanofluidic devices with feedback control; 2) allowing channel or pore sizes to be expanded or narrowed following fabrication; 3) facilitating the filling of nanofluidic devices with aqueous solutions or other liquids.

These and other features and advantages of the present invention will become apparent from the following detailed description of illustrative embodiments thereof, which is to be read in connection with the accompanying drawings.

DETAILED DESCRIPTION OF PREFERRED EMBODIMENTS

Fabrication of nanoscale fluidic elements may be difficult and can require non-standard and/or non-scalable techniques. The present invention allows devices to be created using scalable lithographic or other techniques followed by processing techniques that provide the desired dimensions of the fluidic passages of the elements.

Devices including nanofluidic passages such nanopores and/or nanochannels are provided by the invention. As discussed below, the devices may have properties that allow customization and versatility. Principles of the invention are further employed to provide a device including array of fluidic elements including one or more mechanisms to control fluid flow. The fabrication of such devices can be facilitated by employing methods of manufacture as disclosed herein.

Figures 1A, 1B, 1C, 1D:
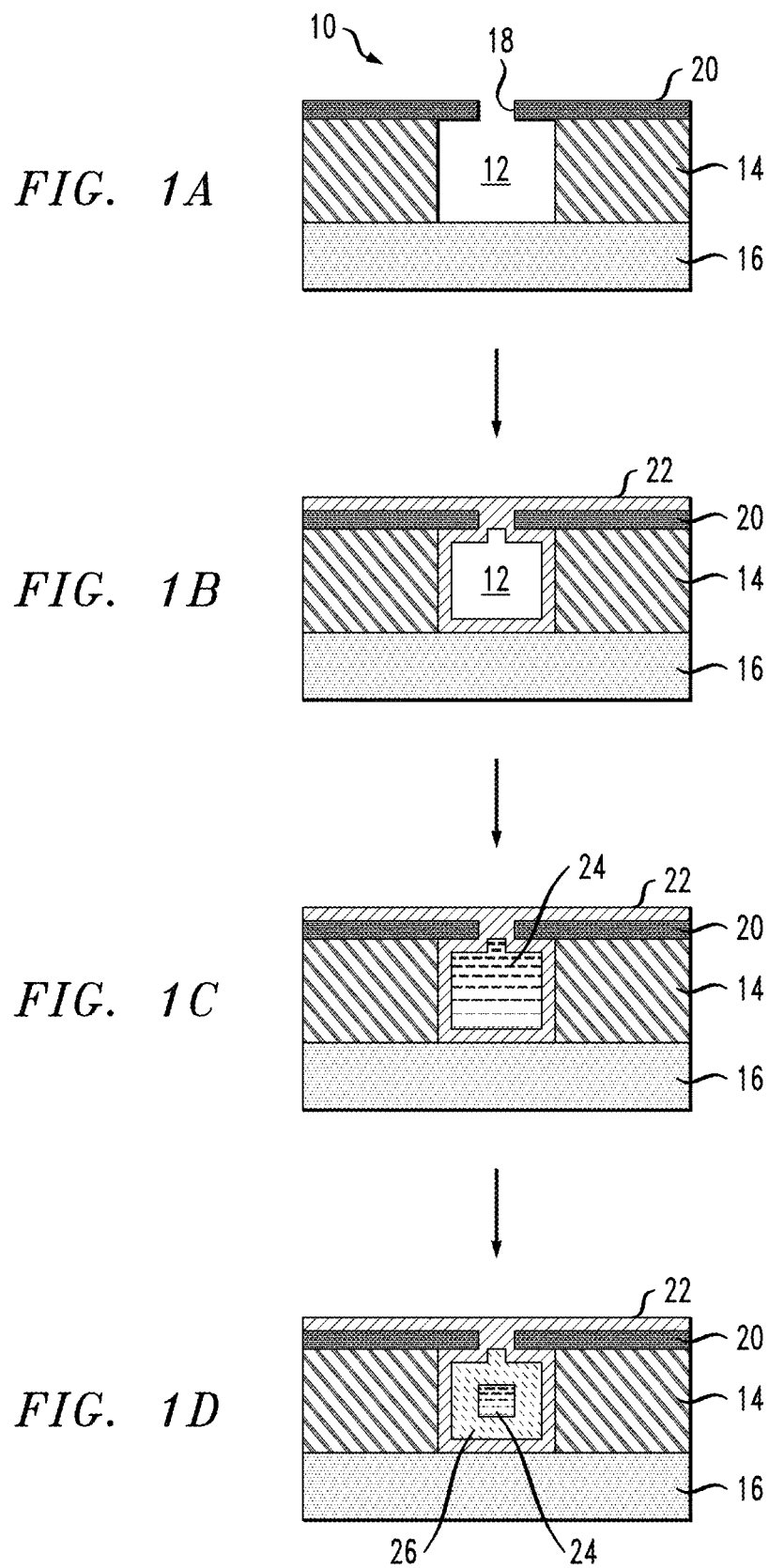
FIGS. 1A-1D show a series of steps for fabricating a fluidic device having one or more channels with selected dimensions.

FIGS. 1A-1D and 2A-2D show manufacturing steps for fabricating fluidic devices having nanochannels and nanopores, respectively. Referring first to FIG. 1A, a fluidic device 10 is formed through lithographic techniques to include a channel 12 running parallel to the surface of the device. Lithographic techniques typically employ the use of a photoresist that is subjected to patterns of light while on a substrate and then removed in part to expose selected portions of the substrate. Subsequent etching steps and other processing result in features such as holes or channels being formed on the substrate. In the exemplary device shown in FIG. 1A, a layer 14 comprising silicon dioxide, silicon or other suitable material(s) is deposited on a substrate or base 16. This layer preferably has isotropic etch characteristics. The layer 14 may be deposited by atomic layer deposition, chemical vapor deposition, physical vapor deposition, thermal oxidation or other suitable procedure. The base 16 may be comprised, for example, of silicon, quartz, or silicon nitride, and is different in composition from the layer 14 deposited thereon.

A layer 20 of silicon nitride, silicon dioxide or other suitable material that is not identical to the material(s) comprising layer 14, is deposited on layer 14 by procedures such as atomic layer deposition, chemical vapor deposition, or physical vapor deposition. A channel opening 18 is formed in the layer 20 using lithographic techniques such as photolithography or electron beam lithograph. A channel 12 is formed in the layer 14 by etching the layer 14 through the channel opening 18, The substrate or base 16 of the device functions as an etch stop. The channel 12 has dimensions that are larger than the dimensions that are ultimately desired, preferably no more than one hundred nanometers in any cross sectional direction. The layer 20 is laterally underetched during fabrication such that the width of the channel opening 18 is smaller than that of the channel 12, resulting in the device as shown in FIG. 1A. As discussed below, the undercut beneath the top layer 20 facilitates closing the opening 18 above the channel 12.

The thickness of the base 16 may be between about 0.25 to 1.0 mm, but is not considered critical. The thickness of the deposited layer 14 depends on the requirements of the device such as channel size. In this exemplary embodiment, the thickness of this layer is between 10 and 1,000 nm. The thickness of the top layer 20 is at least about 50 nm in thickness so that the undercut can be formed with mechanical stability. It is preferably no thicker than what is required to provide such stability. The channel diameter is about one hundred nanometers or less prior to subsequent processing.

Referring to FIG. 1B, the fluidic device 20 is coated by a conductor 22 such as an electrochemically active metal. Such coating can be provided by techniques such as atomic layer deposition (ALD) or chemical vapor deposition (CVD). Metals such as titanium, tantalum, and tungsten are among the materials that can be deposited. Metal alloys may also be deposited. Selection of the materials may depend on the oxides that will be formed as the device is further processed. It will be appreciated that, in certain circumstances, metal may be deposited prior to channel or pore formation and that features such as channels or pores can formed in or through the metal through lithographical/etching techniques. In the exemplary embodiment, the deposited conductor 22 forms a seal to close off the opening 18 to the channel 12. The dimensions of the channel are also reduced by an amount commensurate with the thickness of the deposited conductor that forms the surface of the nanochannel.

The coated fluidic device 10 is filled with an electrolyte 24 such as water or an electrolyte solution as shown in FIG. 1C. Filling the device is facilitated by the fact that the channel 12 is larger than its ultimate target size (e.g. ten nm in diameter or less) even with the conductor coating. An electric potential may be applied to the electrolyte across the fluidic passage to measure the ionic current through the device. The current is proportional to the internal dimensions of the passage. Accordingly, the dimensions of the passage can be determined at this time. The electrodes for creating the ionic current are placed in or near each end of the fluidic passage (channel 12 in the exemplary embodiment). The electrodes may, for example, be Ag/AgCl, Au or Pt wire electrodes.

The dimensions of the channel 12 are reduced in size by forming an oxide layer 26 on the conductor 22, as shown in FIG. 1D. This process is preferably feedback controlled by measuring the ionic current through the device as an electrical potential is applied to the conductor 22. The voltage is applied to the deposited conductor 22 using needle probes, alligator clips or wire bonding. Voltages may range be between 0.5 and 5.0V in typical applications.

Figure 3:
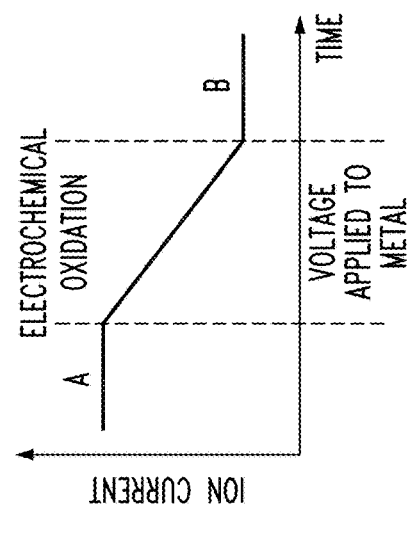
FIG. 3 shows the ionic current through a fluidic passage prior to and during electrochemical oxidation of a metal layer.

FIG. 3 shows the current through the device as the oxidation layer grows from the starting point "A" corresponding to FIG. 1C to the end or target point "B" corresponding to FIG. 1D. The channel dimensions can be monitored continuously or by repeatedly alternating electrochemical oxidation and ionic current measurements. The process is discontinued when the current reaches a level representative of the target channel dimensions, which can be a range of acceptable dimensions. If the oxide layer 26 is insulating, the metal-oxide stack could then function as a gate for altering the surface charge of the device 10 for use in further chemical functionalization, as a nanofluidic transistor, or as a sensor device for chemicals or biological analytes in the fluid. Such a device could also be used as a DNA sensor and/or sequencer. Examples of insulating metal oxides include titanium oxides and platinum oxides. It will be appreciated that conducting oxides could alternatively be formed such as aluminum zinc oxide (AZO) or ruthenium oxide.

Figure 2A:
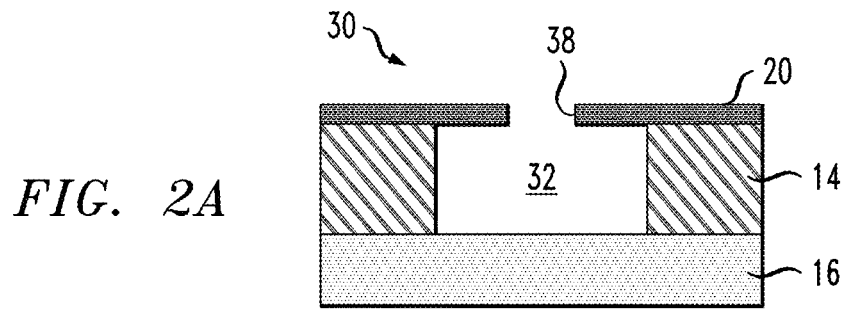
FIGS. 2A-2D show a series of steps for fabricating a fluidic device having one or more nanopores with selected dimensions.
Figure 2B:
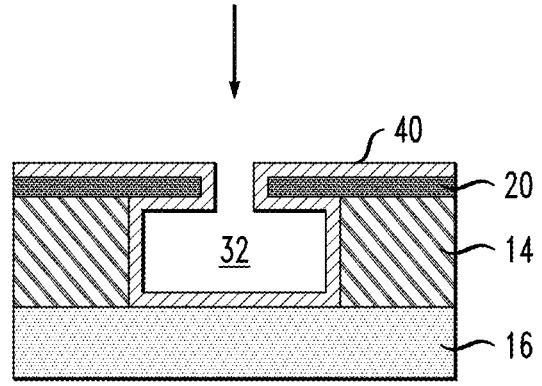
Figure 2C:
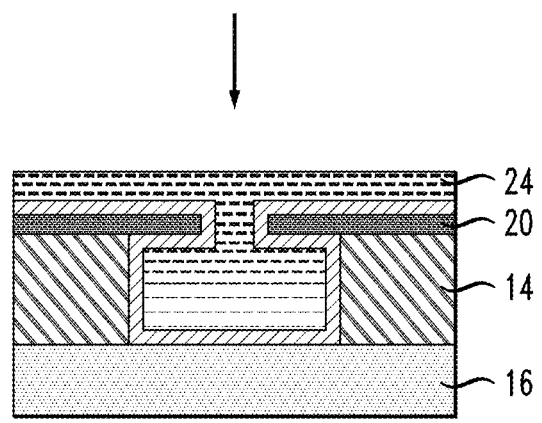
Figure 2D:
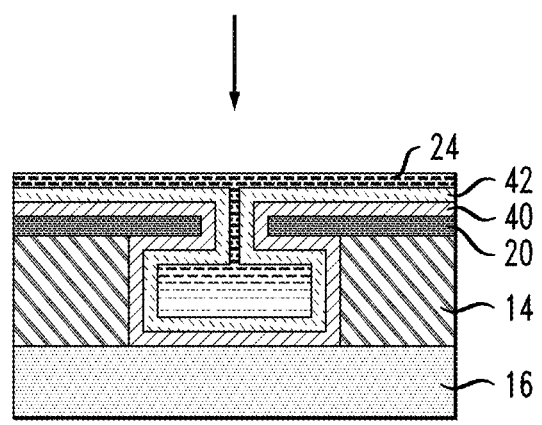

Methods according to the invention are applicable to the formation of nanopores running orthogonal to the surface of the device as well as channels 12 that extend parallel to the surface. Referring to FIG. 2A, a device 30 includes layers 14, 16 and 20 similar to those found in FIGS. 1A-1D. The device is fabricated in a similar manner as the fluidic device 10 discussed above using lithographical techniques and etching. A pore 38 formed in the top layer 20 is in fluid communication with a reservoir 32. The pore 38 can be substantially larger than the target size pore, and may be as much as about 100 nm in diameter. Like the channel 12 in the previous embodiment, the pore is accordingly in the size range considered nanofluidic. A pore having a diameter between two and fifty nanometers can be formed using a transmission electron beam. A pore ten nanometers or larger in diameter can be formed using electron beam or photolithographic patterning. (It will be appreciated that the pore may not be perfectly round, in which case the largest diameter may be about 100 nm or less.) A coating 40 of a conductor such as a metal or other appropriate electrochemically active, electrically conductive material is deposited on the device 30 as shown in FIG. 2B. (Such a coating may be unnecessary if the top layer 20 is comprised of an electrochemically active, electrically conductive material.) The pore size, though reduced by the coating 40, is still larger than the target size. The device is then filled with an electrolyte 24 such as water or an electrolyte solution. The relatively large dimensions of the fluidic portions of the device 30 facilitate introduction of the solution. FIG. 2C shows the fluid-filled device. An electrical potential is then applied to the coating 40 in order to form a conductive or an insulating metal-oxide film 42 as shown in FIG. 2D. The size of the pore is monitored as oxidation occurs. The electrochemical oxidation is discontinued when the pore reaches the target size. It will be appreciated that the target size may be a specific diameter or within a specified range. Unlike the method shown in FIGS. 1A-D where the channel opening 18 is sealed off by the metal, the pore 38 remains open following both metal deposition and oxidation in order to function as a nanofluidic passage.

The formation of nanofluidic passages such as nanopores and nanofluidic channels using the methods described above can be accomplished on a chip by chip, completely customized basis. The methods can also be applied to high-throughput processing done wafer by wafer. The wafers can be separated into individual chips following processing. Pore and/or channel formation using photolithographic techniques facilitate production as opposed to more cumbersome procedures such as TEM drilling. Because the dimensions of the initially formed channels and pores are neither critical nor particularly small, initial processing of the chips or wafers in forming pores and/or channels is facilitated. As discussed above, fluidic devices having relatively large dimensions are also filled with electrolyte or other fluid more easily.

Figure 7:
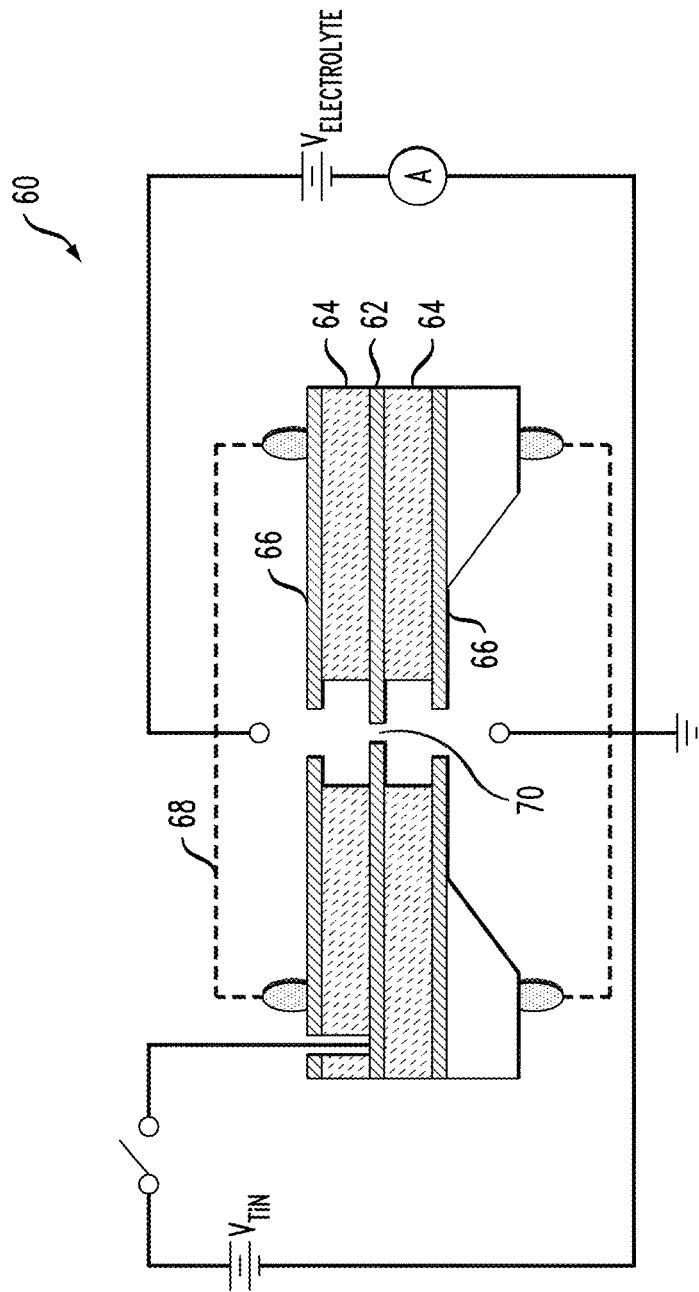
FIG. 7 is a schematic illustration of a test device for changing the diameter of a nanopore.

A test device 60 as shown in FIG. 7 can be used to demonstrate the feasibility of the methods disclosed herein. The device includes a five nanometer thin film 62 of TiN in a stack comprising layers 64, 66 of $SiO_2$ and $Si_3N_4$, respectively. The device includes a fluidic cell 68 containing a KCl solution. The TiN layer includes a pore 70 less than one hundred nanometers in diameter and preferably smaller. About four volts are applied to the TiN away from the fluid volume using a contact pad and needle probe. The measured ionic conductance decreases significantly after a few minutes, indicating the pore 60 has decreased in size.

Devices can be provided to end users in finished or semi-finished forms either as chips or wafers. The end users can perform the oxidation process to provide passages of selected dimensions. The oxidation process can be reversed if necessary to enlarge passage dimensions.

Figure 4:
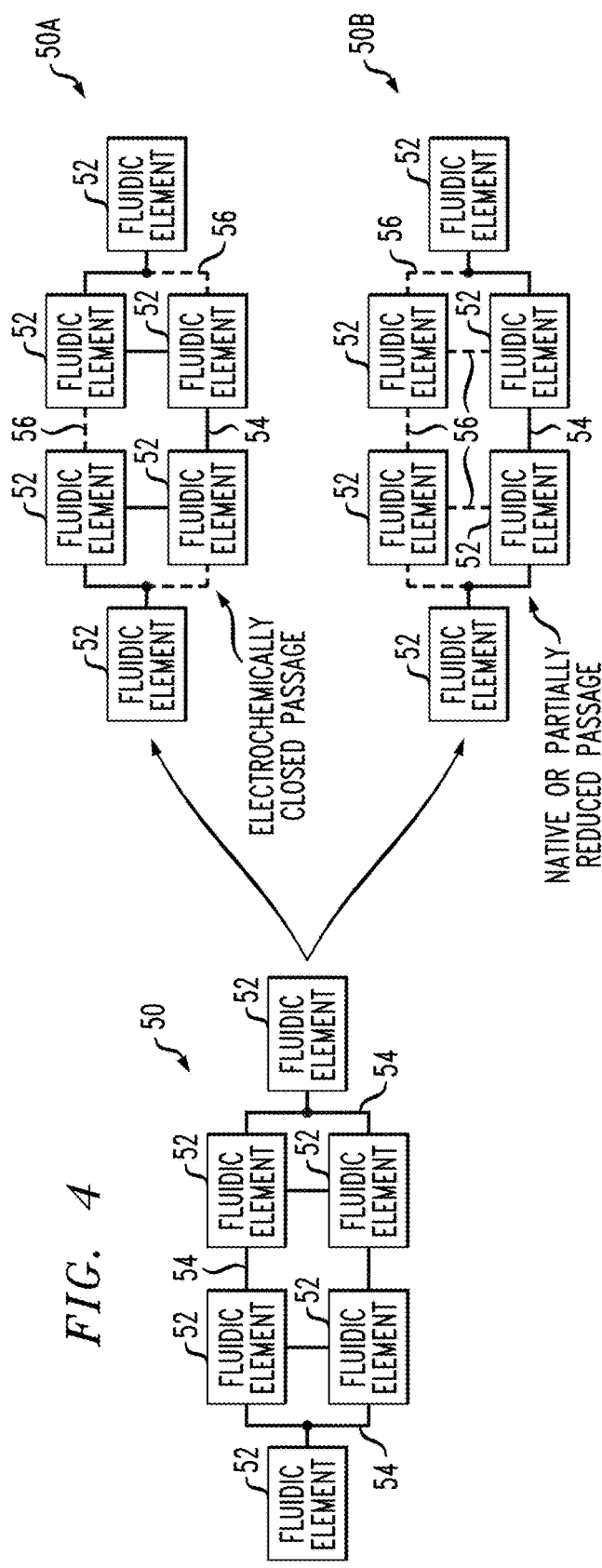
FIG. 4 shows a customizable fluidic device comprising a plurality of fluidic elements.

In accordance with further aspects of the invention, a generic, multipurpose array 50 of fluidic channels or elements 52 may be provided as shown in FIG. 4. Each element is connected to another element by an individually addressable, electrochemically reducible nanofluidic passage 54. The array is preferably fabricated with all connections open. At the point of use, one or more of the reducible nanofluidic passages 54 could be closed in order to redirect fluid flow or remove certain elements 52 from the overall array. As shown in FIG. 4, the original array 50 shown to the left of the figure has been modified in the two alternative ways to produce arrays 50A, 50B having two alternative flowpaths. Native or partially reduced nanofluidic passages 54 appear in solid lines while closed passages 56 are shown in broken lines. The passages 54 may be formed in the same manner as the channels 12 discussed above. Each passage 54 includes an electrically conductive, preferably metal coating (not shown) having an oxide layer that defines the dimensions of the passage. Selected passages are closed by applying electric potential between the electrolyte within the passages and the metal coatings, causing further growth of the oxide layer (not shown) until the passage is entirely closed. The elements 52 can be designed for any particular purpose such as controlling or changing the properties of the fluid or of an entity present within the fluid. It will be appreciated that the passages 54 of the array 50 may include only a metal coating, allowing the end user to partially close certain passages and completely close others through varying degrees of oxidation of the metal coatings. As discussed above, the oxidation process can be reversed to open a previously closed passage 54 if desired.

Figure 8A:
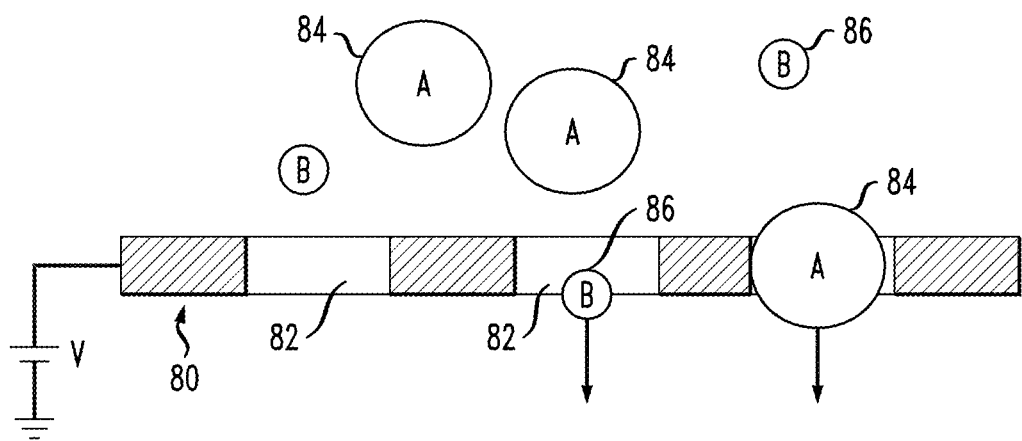
FIGS. 8A and 8B show a nanofilter membrane prior to and following electrochemical oxidation.
Figure 8B:
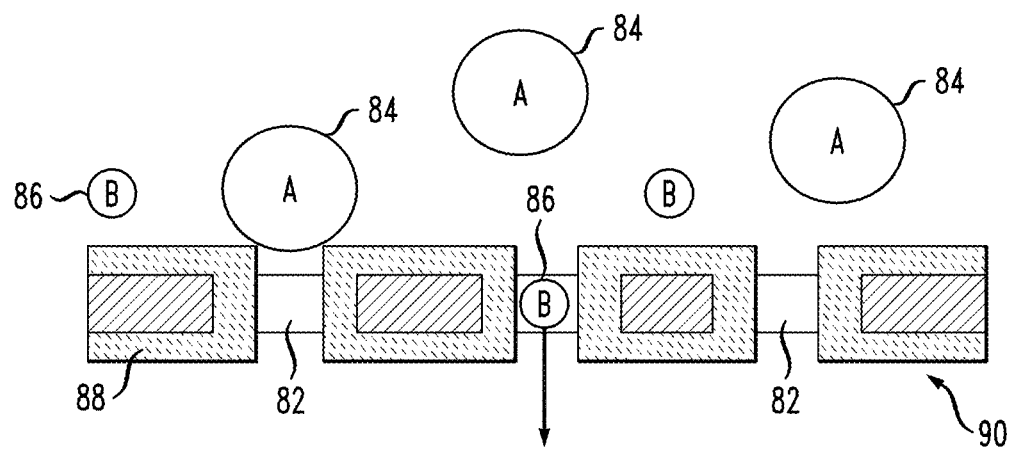

A further exemplary embodiment of the invention is shown in FIGS. 8A and 8B, and relate to the fabrication of a nanofilter having a large plurality of nanofluidic passages using principles of the invention. The nanofilter is fabricated from an electrically conductive substrate 80. The substrate 80 includes a plurality of nanopores 82 that can be formed using lithographic techniques and etching. Alternatively, the nanopores can be formed employing a technique known as Directed Self-Assembly (DSA). This technique involves the following steps: (i) a substrate surface is chemically functionalized so that nanoparticles, for example block-copolymers, adhere on it upon dispersing a fluid containing such nanoparticles onto the substrate surface, (ii) the membrane is annealed evaporating away the fluid leaving the nanoparticles on the substrate surface, and (iii) the nanoparticles are then used either as a positive or negative hard etch mask to further transfer the nanoparticle array pattern down into the substrate thus forming a nanopore membrane in the substrate. Upon flood-dispersion onto the functionalized substrate surface, nanoparticles form self-aligned pattern arrays comprising a self-defined spacing between neighboring particles without the need to perform any additional alignment and/or patterning processes. Spacing thereby depends on the type and size of the nanoparticles, topography of the substrate surface, as well as the type of functionalization thereof. One can achieve grating patterns as well as dot (i.e. nanopore) patterns.

Figure 10:
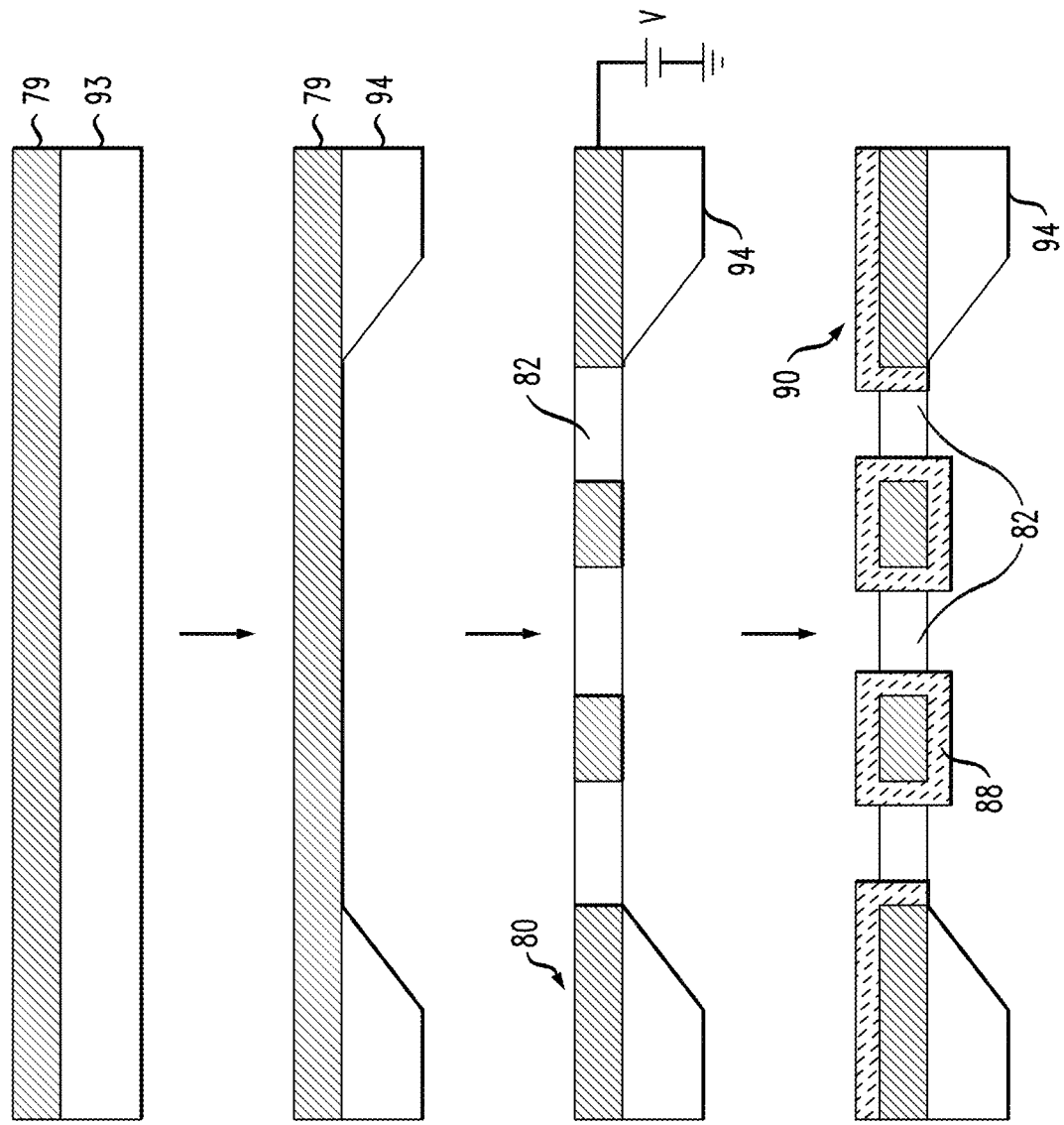
FIG. 10 shows a sequence of steps for fabricating a nanofilter.

FIG. 10 illustrates steps that can be employed for fabricating a nanofilter in accordance with the invention. A metal film 79 is deposited on a substrate 93 having dielectric properties. The filter membrane is created by removing the center portion of the substrate 93, thereby forming an insulator 94 that supports the membrane. A pattern of nanopores 82 is formed in the membrane portion of the metal layer 79 using techniques as described above, thereby providing a nanofilter substrate 80. As described further below, voltage is applied to reduce the pore size until a desired filter size is reached.

The pores formed in the substrate 80 of the exemplary embodiment are one hundred nanometers or less in diameter, and are preferably similar in size. In this embodiment, the substrate is comprised of an electrochemically active, electrically conductive material. The deposition of a metal coating on the substrate accordingly is not required. As shown in FIG. 8A, both relatively large and small particles 84, 86 having sizes "A" and "B" are capable of passing through the pores. The substrate is placed in an electrolyte. A baseline reading of conductance or current through the substrate membrane is obtained. Voltage is applied to the substrate 80 to cause the formation of an oxide layer 88 on the surfaces bounding the nanopores 82 as shown in FIG. 8B. When the pore sizes have been reduced to the target diameters, as evidenced by changes in current density or other suitable parameter, the process is discontinued. Referring again to FIG. 8B, the pores 82 have been reduced in diameter such that only the relatively small particles 86 having size "B" or less are able to pass therethrough. The resulting nanofilter 90 can be provided to users in the form of a wafer or chip or incorporated within a fluidic device. It will be appreciated that the voltage applied to the nanofilter 90 can be reversed, thereby increasing the diameters of the nanopores 82. In use, a liquid can be passed through the filter via electro-osmosis or other suitable technique in order to filter particles larger than the pore sizes.

Figure 9:
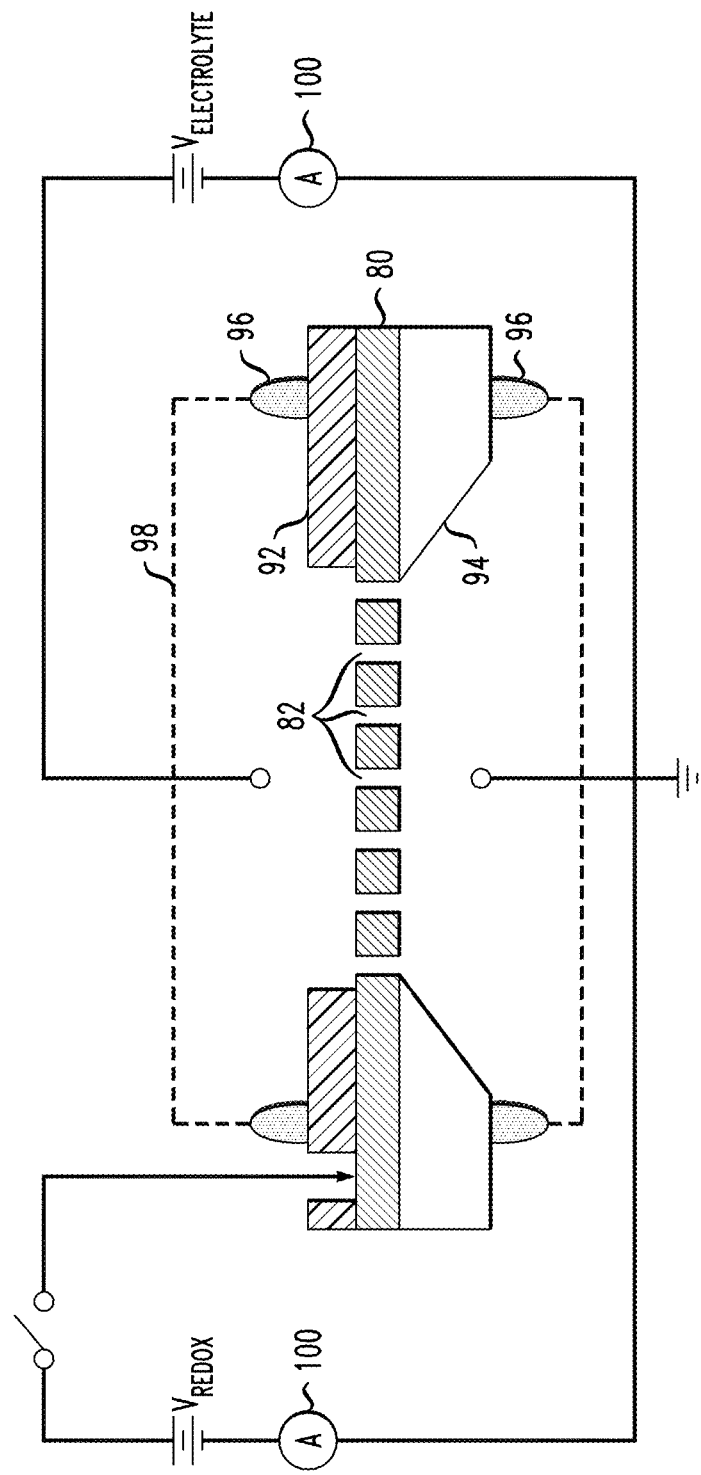
FIG. 9 is a schematical illustration of a fluidic device including a nanofilter membrane.

FIG. 9 is a schematic illustration of a nanofluidic device including a system that may be used to increase or decrease pore diameters in a substrate 80 or nanofilter 90 and provide feedback relating to pore diameter. In this exemplary embodiment, an electrically conductive substrate 80 is mounted between first and second insulators 92, 94. The porous membrane portion of the substrate 80 is positioned within a liquid cell 98 that contains an electrolyte. O-rings 96 provide seals isolating part of the substrate 80 from the liquid cell 98. An electrical connection is made to the substrate outside the liquid cell by a needle probe or wire bond. A first microammeter 100 is provided for monitoring the voltage applied to the substrate. A second microammeter 100 is employed for measuring current through the substrate 80 or nanofilter 90. The second microammeter provides feedback relating to pore diameter as the ionic current is proportional to the sizes of the nanopores 82 in the substrate. The oxidation or reduction process can be terminated upon obtaining a reading from the second microammeter that corresponds to a targeted average pore diameter. It will be appreciated that the measurement of the ionic current through the membrane portion of the substrate 80 can be expressed in units of conductance. The conductance decreases as pore diameter decreases.

Figure 5:
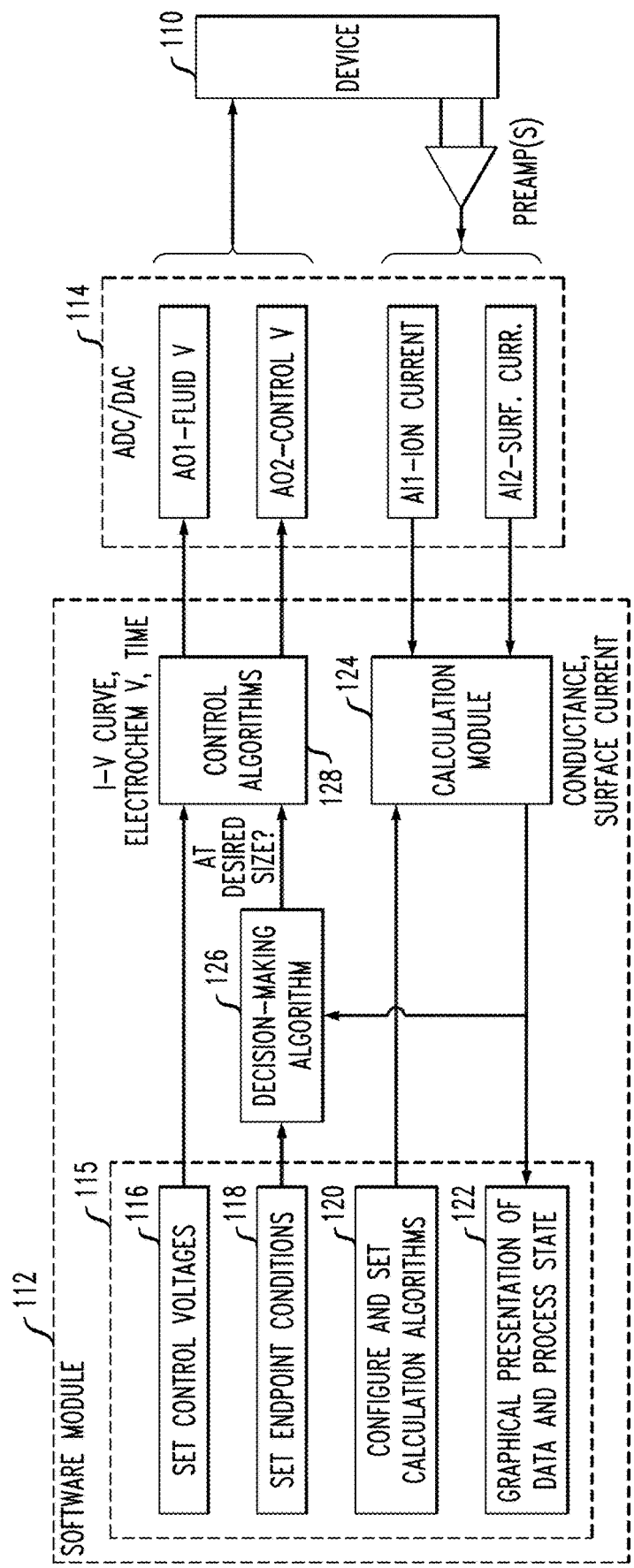
FIG. 5 is a schematical illustration showing a software module for controlling the fabrication of nanofluidic devices.

FIG. 5 provides a schematical illustration of a system for controlling the fabrication methods discussed above. The system includes a nanofluidic device 110 such as those discussed above, a software module 112, and analog to digital/digital to analog converter 114. The software module includes a user interface 115 comprising a "set control voltages" control 116, a "set endpoint conditions" control 118, a "configure and set calculation algorithms" control 120, and a display 122 providing a graphical presentation of data and process state. The "set control voltages" control 116 allows the user to set the voltages employed for both oxidizing the substrate (e.g. the metal substrate 80 or coated fluidic devices 10 or 30) and causing an ionic current through the substrate. The "set endpoint conditions" control 118 provides the ability to automatically terminate the oxidation (or reduction) process when the ionic current reaches a level corresponding to a targeted nanopore or nanochannel size. The control 120 for configuring and setting calculation algorithms allows the user to set the algorithms employed in a calculation module 124. The module memory stores a decision-making algorithm 126 that receives input from the "set endpoint conditions" control 118. The decision making algorithm "control algorithms" software 126 and the "set control voltages" control 116 provide input to "control algorithms" software 128.

The "control algorithms" software 128 controls the voltage applied for electrochemical oxidation and/or reduction and process time. It further controls the voltage for generating the ionic current through the nanofluidic device 110 when feedback relating to pore or channel size is required. Inputs relating to ionic current and surface current are provided to the calculation module 124. The ionic conductance of the fluidic device is determined in the calculation module 124 which, in turn, provides conductance information to the decision-making algorithm software 126. As the ionic conductance information is related to pore or channel size, this information is provided to the decision-making algorithm 126 to determine whether further oxidation or reduction is required. Information from the calculation module 124 is also provided to the graphical display 122.

Given the discussion thus far, it will be appreciated that, in general terms, an exemplary method, according to an aspect of the invention, includes the steps of providing a substrate comprising a nanofluidic passage bounded by an electrical conductor, filling the nanofluidic passage with an electrolyte, and causing the nanofluidic passage to at least partially close by electrochemically forming an oxide layer on the conductor. The method is reversible so that the passage dimensions can be increased. The substrate itself can comprise the electrical conductor or an electrically conductive film can be deposited on the substrate.

In accordance with a further aspect of the invention an exemplary method includes forming a nanofluidic passage having larger than targeted dimensions in a substrate, forming a conductive layer on the substrate, thereby reducing the dimensions of the nanofluidic passage, filling the nanofluidic passage with an electrolyte, and electrochemically oxidizing the conductive layer until the fluidic passage has the targeted dimensions.

A further exemplary method comprises providing a nanofluidic device including a nanofluidic passage having an electrically conductive surface and an electrolyte within the nanofluidic passage and applying a voltage to the electrically conductive surface to electrochemically change the dimensions of the nanofluidic passage. As discussed above, the nanofluidic passage can comprise passages such as nanopores or nanochannels. The method is also applicable to changing the dimensions of a large plurality of passages at the same time such as passages found in the membrane of a nanofilter.

A further exemplary method relates to use of an array of fluidic elements. Such a method comprises providing an array of fluidic elements, each of the fluidic elements being connected to one or more other fluidic elements in the array by one or more nanofluidic passages. Each of the nanofluidic passages includes an electrically conductive surface. The method further comprises selectively closing one or more of the nanofluidic passages by causing an oxidized layer to electrochemically grow on the electrically conductive surface in selected nanofluidic passages. An array of fluidic elements connected by nanofluidic passages and a system for electrochemically changing or closing the passages is further provided.

A computer program product is provided for controlling the fabrication of a nanofluidic device that includes a nanofluidic passage in a substrate, the nanofluidic passage comprising an electrically conductive surface and containing an electrolyte. A computer readable storage medium having computer readable program code embodied therewith comprises: computer readable program code configured to facilitate applying an electric potential between the electrolyte and the electrically conductive surface sufficient to cause oxidation of the electrically conductive surface and computer readable program code configured to monitor ionic current through the nanofluidic passage.

A nanofilter having a filter membrane including nanofluidic passages that can be electrochemically changed to larger or smaller sizes is further provided. As discussed above, the membrane can be comprised of a conductor or include a conductive coating that can be electrochemically oxidized. A nanofilter assembly provided as a further aspect of the invention preferably includes a feedback mechanism for determining the ionic current through the filter membrane as well as a mechanism for causing electrochemical oxidation. The extent to which the nanofluidic passages have been narrowed or expanded can be determined from the feedback mechanism. FIG. 9 provides an exemplary embodiment of the nanofilter assembly including a filter membrane, a mechanism for causing oxidation, and a mechanism for determining ionic current. FIG. 8A shows the membrane portion of a nanofilter that has been subjected to oxidation to reduce the size of the nanofluidic channels. The process can be reversed to enlarge the nanofluidic channels.

Exemplary System and Article of Manufacture Details

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

One or more embodiments of the invention, or elements thereof, can be implemented in the form of an apparatus including a memory and at least one processor that is coupled to the memory and operative to perform exemplary method steps such as measuring ionic current and creating the electric potential used for metal layer oxidation.

Figure 6:
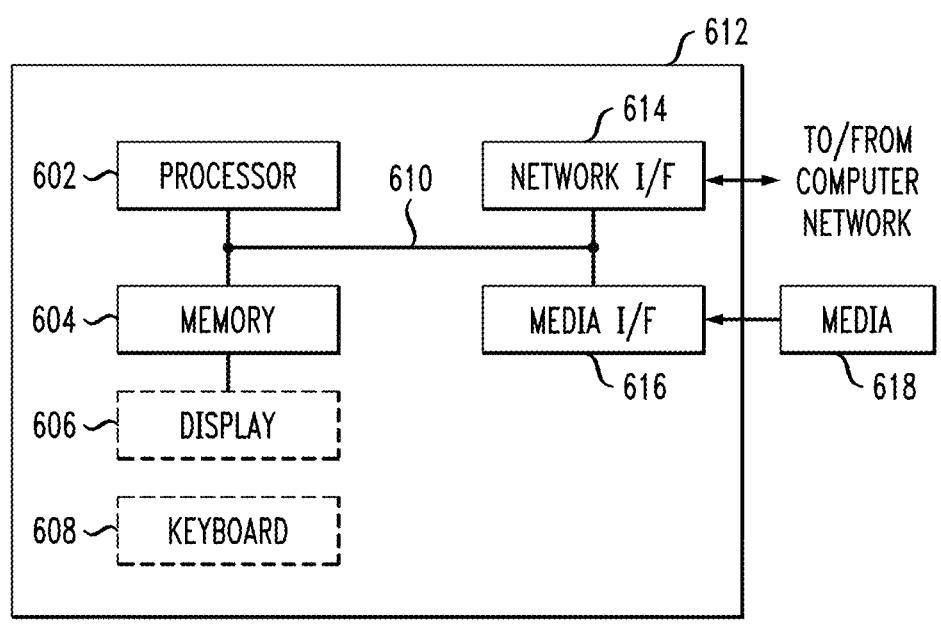
FIG. 6 depicts a computer system that may be useful in implementing one or more aspects and/or elements of the invention.

One or more embodiments can make use of software running on a general purpose computer or workstation. With reference to FIG. 6, such an implementation might employ, for example, a processor 602, a memory 604, and an input/output interface formed, for example, by a display 606 and a keyboard 608. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 602, memory 604, and input/output interface such as display 606 and keyboard 608 can be interconnected, for example, via bus 610 as part of a data processing unit 612. Suitable interconnections, for example via bus 610, can also be provided to a network interface 614, such as a network card, which can be provided to interface with a computer network, and to a media interface 616, such as a diskette or CD-ROM drive, which can be provided to interface with media 618. Interfaces can be provided to microammeters and/or current supplies and the like, over a network or other suitable interface, analog-to-digital converter, or the like.

Accordingly, computer software including instructions or code for performing the methodologies of the invention, as described herein with respect to FIGS. 1A-D, 2A-D, 8A-B and 10 may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 602 coupled directly or indirectly to memory elements 604 through a system bus 610. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 608, displays 606, pointing devices, and the like) can be coupled to the system either directly (such as via bus 610) or through intervening I/O controllers (omitted for clarity).

Network adapters such as network interface 614 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 612 as shown in FIG. 6) running a server program. It will be understood that such a physical server may or may not include a display and keyboard.

As noted, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Media block 618 is a non-limiting example. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language, BASIC programming language, or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustration and/or block diagram, such as provided in FIG. 5, and combinations of blocks in the flowchart illustration and/or block diagram, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagram in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a computer readable storage medium; the modules can include, for example, any or all of the elements depicted in the block diagram and/or described herein; by way of example and not limitation, an initialization module, a module to cycle through the test points and parameters, an output module to generate the output file, a post-processing module to reduce the data and search for anomalies, and the like. The method steps can then be carried out using the distinct software modules and/or sub-modules of the system, as described above, executing on one or more hardware processors 602.

Further, a computer program product can include a computer-readable storage medium with code adapted to be implemented to carry out one or more method steps described herein, including the provision of the system with the distinct software modules.

In any case, it should be understood that the components illustrated herein may be implemented in various forms of hardware, software, or combinations thereof; for example, application specific integrated circuit(s) (ASICS), functional circuitry, one or more appropriately programmed general purpose digital computers with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of fabricating a nanofluidic device, comprising:
    forming a nanofluidic passage having larger than targeted dimensions in a substrate, wherein the nanofluidic passage is a channel formed with an opening in a surface of the substrate;
    forming a conductive layer on the substrate, thereby reducing the dimensions of the nanofluidic passage and closing the opening;
    filling the nanofluidic passage with an electrolyte;
    electrochemically oxidizing the conductive layer;
    monitoring the size of the nanofluidic passage by measuring ionic current through the nanofluidic channel; and
    discontinuing electrochemically oxidizing the conductive layer when the ionic current reaches a level corresponding to the targeted dimensions.

2. A method of fabricating a nanofluidic device, comprising:
    obtaining a structure including a base and a non-metallic layer on the base;
    forming a nanochannel within the non-metallic layer of the structure;
    forming an electrically conductive layer within the nanochannel, the electrically conductive layer forming a surface of the nanochannel having a bottom portion extending over the base and sidewall portions adjoining the non-metallic layer;
    electrochemically oxidizing the electrically conductive layer to reduce the dimensions of the nanochannel by:
        filling the nanochannel with an electrolyte; and
        applying a voltage to the electrically conductive layer, thereby forming an oxide layer on the electrically conductive layer, the oxide layer adjoining the bottom portion and the sidewall portions of the electrically conductive layer;
    creating an ionic current through the nanochannel;
    measuring the ionic current;
    monitoring the size of the nanofluidic passage by measuring ionic current through the nanochannel; and
    discontinuing electrochemically oxidizing the electrically conductive layer when the ionic current reaches a level corresponding to targeted dimensions of the nanochannel.

3. The method of claim 2, wherein the structure further includes a top layer on the non-metallic layer, further including:
    forming a channel opening within the top layer of the structure; and
    closing the channel opening while forming the electrically conductive layer.

4. The method of claim 2, further including reversing the voltage applied to the electrically conductive layer, thereby enlarging the dimensions of the nanochannel.

5. The method of claim 2, wherein the nanochannel extends down to the base, the bottom portion of the electrically conductive layer being formed within the nanochannel and on the base.

* * * * *